(12) United States Patent
Yu et al.

(10) Patent No.: US 11,398,439 B2
(45) Date of Patent: Jul. 26, 2022

(54) DISPLAY PANEL AND DISPLAY DEVICE

(71) Applicants: ORDOS YUANSHENG OPTOELECTRONICS CO., LTD., Inner Mongilia (CN); BOE TECHNOLOGY GROUP CO., LTD., Beijing (CN)

(72) Inventors: Yanan Yu, Beijing (CN); Shuai Han, Beijing (CN); Wenlong Zhang, Beijing (CN); Peng Li, Beijing (CN); Huijie Zhang, Beijing (CN); Jingyi Xu, Beijing (CN); Yanfeng Li, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 107 days.

(21) Appl. No.: 16/984,336

(22) Filed: Aug. 4, 2020

(65) Prior Publication Data

US 2021/0118823 A1 Apr. 22, 2021

(30) Foreign Application Priority Data

Oct. 21, 2019 (CN) .......................... 201911001389.0

(51) Int. Cl.
*H01L 23/60* (2006.01)
*H01L 23/498* (2006.01)
(Continued)

(52) U.S. Cl.
CPC ........ *H01L 23/60* (2013.01); *H01L 23/49838* (2013.01); *G06F 3/044* (2013.01); *G06F 3/0412* (2013.01)

(58) Field of Classification Search
CPC ....................................................... H01L 23/60
(Continued)

(56) References Cited

U.S. PATENT DOCUMENTS

2018/0040607 A1   2/2018   Xiong et al.
2018/0107052 A1*  4/2018   Jiang ................. G02F 1/133514
(Continued)

FOREIGN PATENT DOCUMENTS

CN   103926742   7/2014
CN   105093629   11/2015
(Continued)

OTHER PUBLICATIONS

Office action from Chinese Application No. 201911001389.0 dated Mar. 29, 2021.

*Primary Examiner* — Sherman Ng
(74) *Attorney, Agent, or Firm* — Calfee, Halter & Griswold LLP

(57) ABSTRACT

The present disclosure provides a display panel and a display device. The display panel includes a display region, a frame region surrounding the display region, a color filter substrate, and an array substrate opposite to the color filter substrate. A black matrix is disposed on a side of the color filter substrate facing the array substrate. The array substrate is provided with a grounding portion located in the frame region. The grounding portion is electrically connected to a portion of the black matrix located in the frame region through a conductive portion. The portion of the black matrix located in the frame region is provided with a first through groove surrounding the display region. The first through groove penetrates the black matrix along a thickness direction of the black matrix. A portion of the first through groove is located between the conductive portion and the display region.

18 Claims, 5 Drawing Sheets

(51) Int. Cl.
  *G06F 3/041*    (2006.01)
  *G06F 3/044*    (2006.01)

(58) Field of Classification Search
  USPC .......................................................... 361/220
  See application file for complete search history.

(56)             References Cited

U.S. PATENT DOCUMENTS

2018/0299724  A1*  10/2018  Gu .................... G02F 1/133512
2019/0146256  A1    5/2019  Zhang et al.

FOREIGN PATENT DOCUMENTS

| CN | 105425457  | 3/2016  |
| CN | 105445998  | 3/2016  |
| CN | 105975120  | 9/2016  |
| CN | 106054444  | 10/2016 |
| CN | 106773430  | 5/2017  |
| CN | 106950747  | 7/2017  |
| CN | 107065272  | 8/2017  |
| CN | 108333834  | 7/2018  |
| CN | 10911607   | 1/2019  |
| CN | 109116607  | 1/2019  |
| CN | 110187579  | 8/2019  |
| JP | 2015011179 | 1/2015  |

* cited by examiner

DISPLAY PANEL AND DISPLAY DEVICE

RELATED APPLICATION

The present application claims the benefit of Chinese Patent Application No. 201911001389.0 filed on Oct. 21, 2019, the entire disclosure of which is incorporated herein by reference.

TECHNICAL FIELD

The present disclosure relates to the field of display, especially to a display panel and a display device.

BACKGROUND

With the advent of the "full screen" era, mobile phones with high screen proportion have become popular among consumers. In order to adapt to this trend, mobile phone manufacturers have adopted the COF (chip on film) technology to reduce space at the upper and lower ends of a mobile phone.

As the frame becomes narrower, the capacitance value on the periphery of the panel is affected more and more severely. When the peripheral area is narrowed, the influence of silver paste coating on the capacitance value of the display region on a side close to the silver paste is particularly serious.

SUMMARY

In view of the above-mentioned defects or deficiencies in the prior art, it is desirable to provide a display panel and a display device that reduce the influence on the capacitance value of the display region.

According to a first aspect of the present disclosure, there is provided a display panel. The display panel comprises: a display region, a frame region surrounding the display region, a color filter substrate, and an array substrate opposite to the color filter substrate. A black matrix is disposed on a side of the color filter substrate facing the array substrate; the array substrate is provided with a grounding portion located in the frame region; the grounding portion is electrically connected to a portion of the black matrix located in the frame region through a conductive portion. The portion of the black matrix located in the frame region is provided with a first through groove surrounding the display region; the first through groove penetrates the black matrix along a thickness direction of the black matrix; a portion of the first through groove is located between the conductive portion and the display region.

Optionally, the first through groove completely separates the conductive portion from the display region.

Optionally, the portion of the black matrix located in the frame region is further provided with a second through groove surrounding the display region; the second through groove is located on a side of the display region away from the first through groove; the second through groove penetrates the black matrix along the thickness direction of the black matrix; a disconnection region is disposed between the first through groove and the second through groove.

Optionally, the frame region comprises a first side and a second side that are adjacent and perpendicular to each other, the grounding portion being located at the first side; the first through groove comprises a first isolation portion located between the conductive portion and the display region and arranged along a length direction of the first side.

Optionally, the first through groove further comprises a first extension portion, the first extension portion being connected to the first isolation portion and extending toward the second through groove along a length direction of the second side; the disconnection region is located between the first extension portion and the second through groove.

Optionally, at a position where the first extension portion is provided on the black matrix, the black matrix comprises a first sub-black matrix and a second sub-black matrix located on two sides of the first extension portion respectively, the first sub-black matrix being located on a side of the first extension portion away from the display region, the first sub-black matrix having a width greater than or equal to 100 µm.

Optionally, the second through groove comprises a second isolation portion located on a side of the black matrix opposite to the conductive portion and arranged along a length direction of the first side.

Optionally, the second through groove further comprises a second extension portion, the second extension portion being connected to the second isolation portion and extending toward the first through groove along a length direction of the second side; the disconnection region is located between the second extension portion and the first through groove.

Optionally, at a position where the second extension portion is provided on the black matrix, the black matrix comprises a third sub-black matrix and a fourth sub-black matrix located on two sides of the second extension portion respectively, the third sub-black matrix being located on a side of the second extension portion away from the display region, the third sub-black matrix having a width greater than or equal to 100 µm.

Optionally, a length of the disconnection region along a length direction of the second side is greater than or equal to one third of a length of the second side.

Optionally, the black matrix further comprises a third through groove located between the first through groove and the second through groove.

Optionally, a width of the first through groove and a width of the second through groove are in a range of 20-50 µm.

Optionally, a cross section of the first through groove and a cross section of the second through groove are both rectangular.

According to a second aspect of the present disclosure, there is provided a display device comprising the display panel described in any one of the foregoing embodiments.

BRIEF DESCRIPTION OF THE DRAWINGS

In order to more clearly illustrate embodiments of the present disclosure or technical solutions in the prior art, the drawings to be used for description of the embodiments or the prior art will be briefly introduced below. Obviously, the drawings described below are only some embodiments of the present disclosure. A person having an ordinary skill in the art may also obtain other drawings based on these drawings without spending inventive efforts.

DETAILED DESCRIPTION OF THE DISCLOSURE

The technical solutions in embodiments of the present disclosure will be described clearly and comprehensively below in conjunction with the drawings in the embodiments of the present disclosure. Obviously, the described embodiments are only part of the embodiments of the present disclosure, rather than all of them. All other embodiments obtained by a person having an ordinary skill in the art based on the embodiments of the present disclosure without spending inventive efforts fall within the protection scope of the present disclosure.

Figure 1:
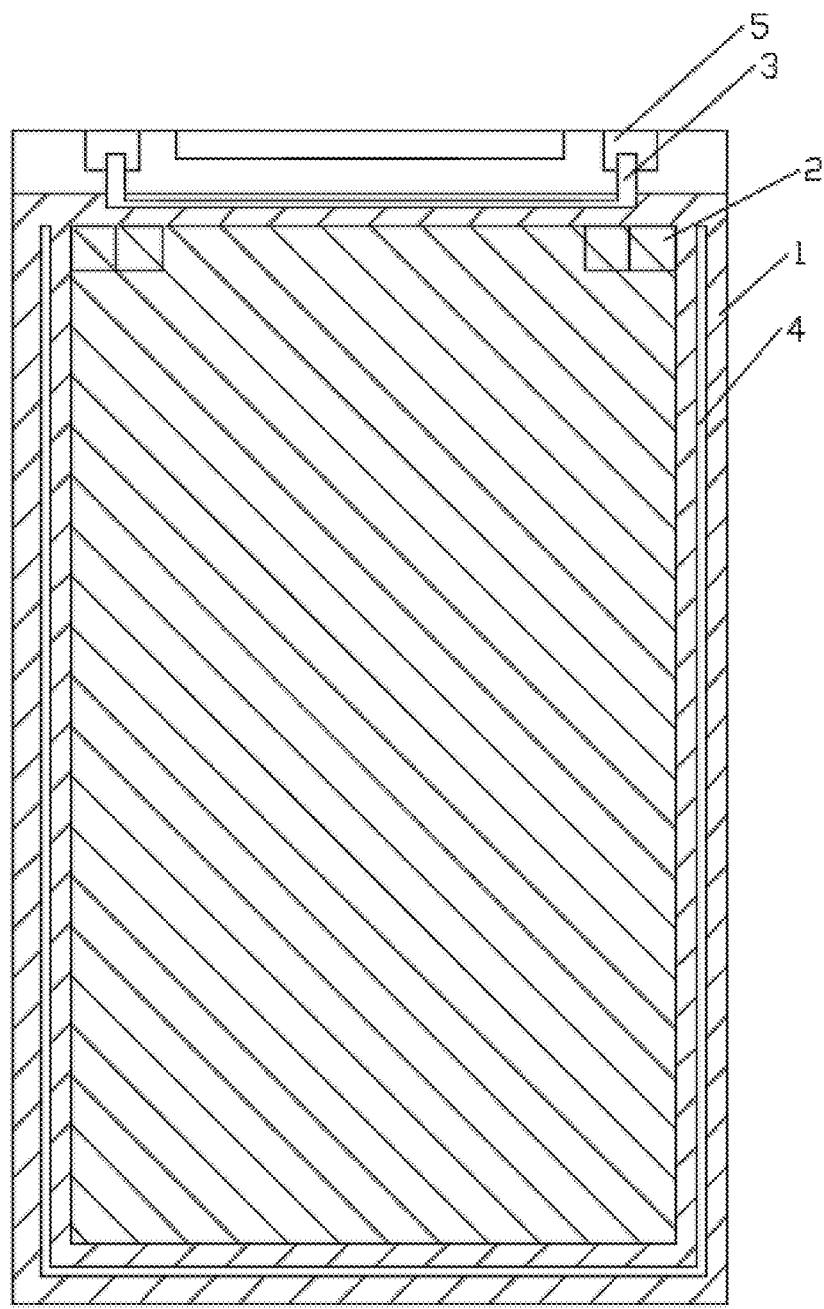
FIG. 1 is a schematic view illustrating the structure of a display panel.
Figure 2:
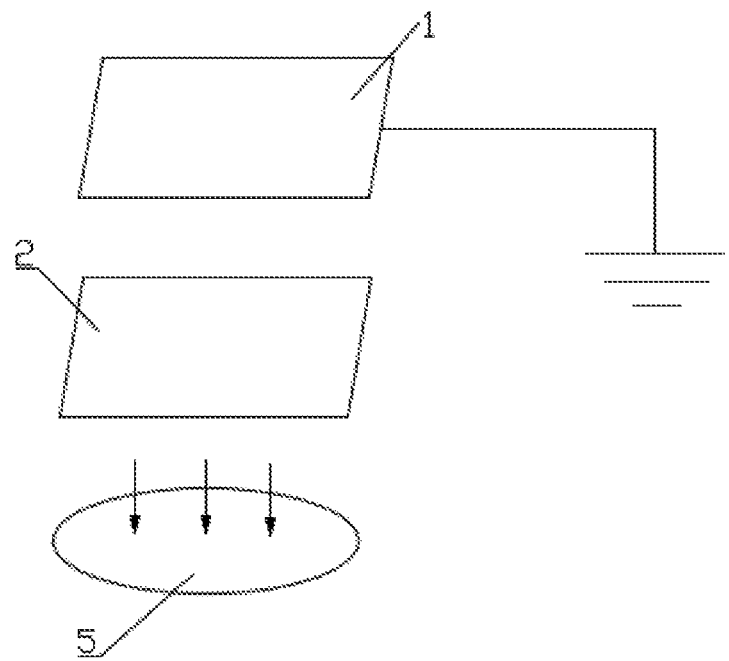
FIG. 2 is a schematic view illustrating the capacitance value of the display panel shown in FIG. 1 at a position away from the conductive silver paste.
Figure 3:
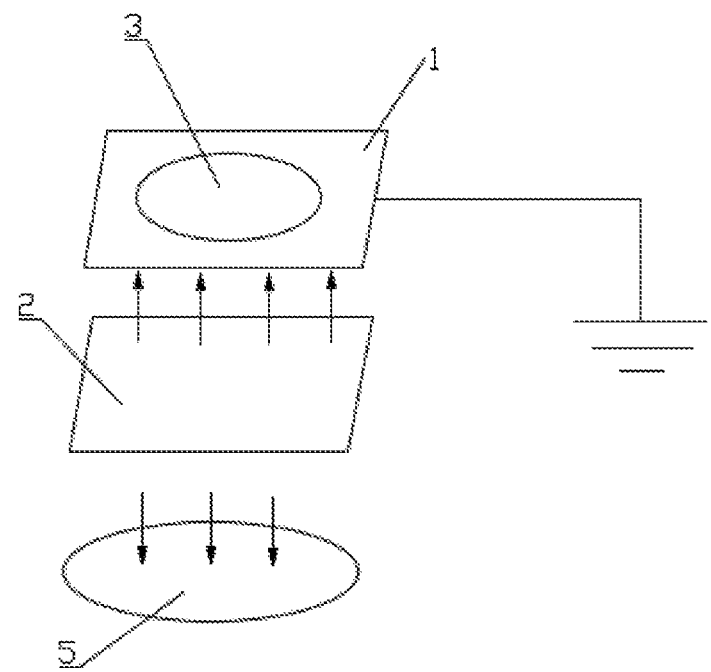
FIG. 3 is a schematic view illustrating the capacitance value of the display panel shown in FIG. 1 at a position close to the conductive silver paste.

Referring to FIGS. 1-3, FIG. 1 illustrates a COF black matrix hollowing design, in which a through groove 4 is set to be "U"-shaped. Static electricity accumulated on a black matrix 1 can be discharged through a conductive silver paste 3 connected to a grounding portion 5.

FIG. 2 is a schematic view illustrating the capacitance value of the display panel at a position away from the conductive silver paste. During electrostatic discharge, the black matrix 1 and the touch electrode 2 cannot form an effective capacitance due to the high resistance value of the black matrix 1. Therefore, the touch electrode 2 has a normal capacitance value at a position of the display panel away from the conductive silver paste 3, which can be touched normally.

FIG. 3 is a schematic view illustrating the capacitance value at a position of the display panel close to the conductive silver paste 3. The conductive silver paste 3 has a small resistance value. In a COF product, at a position of the display panel close to the conductive silver paste 3, the conductive silver paste 3 is very close to the first row of touch electrode 2. During electrostatic discharge, the touch electrode 2 close to the conductive silver paste 3 forms a capacitance with the conductive silver paste 3, which increases the capacitance value of the touch electrode 2 on a side close to the conductive silver paste 3, resulting in poor touch.

Figure 4:
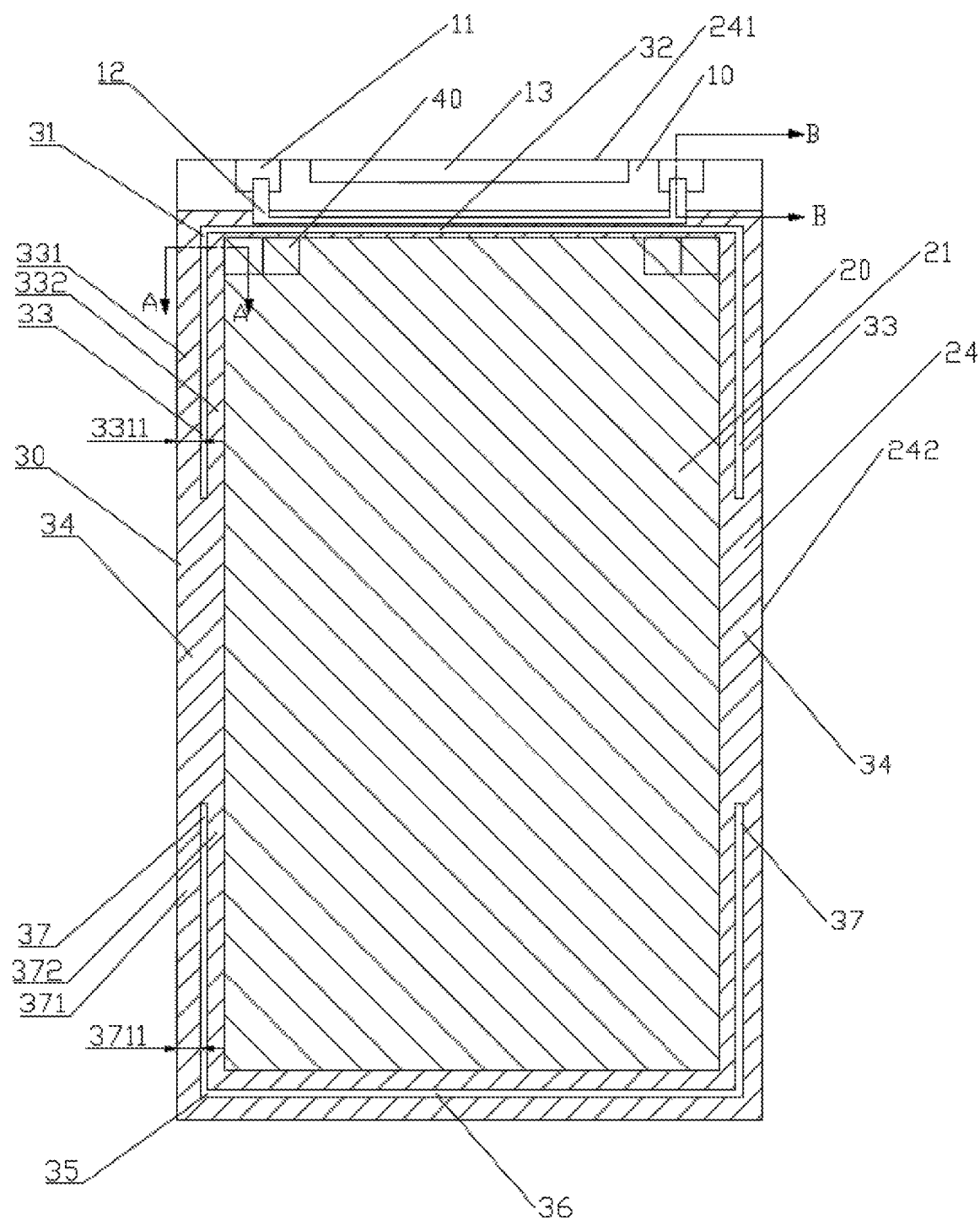
FIG. 4 is a schematic view illustrating the structure of a display panel according to an embodiment of the disclosure.

FIG. 4 is a schematic view illustrating the structure of a display panel according to an embodiment of the disclosure. The display panel comprises a display region 21, a frame region 24 surrounding the display region 21, a color filter substrate 20, and an array substrate 10 opposite to the color filter substrate 20. A black matrix 30 is provided on a side of the color filter substrate 20 facing the array substrate 10. The array substrate 10 is provided with a grounding portion 11, and the grounding portion 11 is located in the frame region 24. The grounding portion 11 is electrically connected to a portion of the black matrix 30 located in the frame region 24 through a conductive portion 12. The portion of the black matrix 30 located in the frame region 24 is provided with a first through groove 31 surrounding the display region 21. The first through groove 31 penetrates the black matrix 30 along the thickness direction of the black matrix 30. A portion of the first through groove 31 is located between the conductive portion 12 and the display region 21.

According to the embodiment of the present application, a first through groove is disposed between the conductive portion and the display region, and the first through groove penetrates the black matrix along the thickness direction of the black matrix to separate the display region from the conductive portion. The first through groove plays the role of shielding the conductive portion so as to avoid spurious explosion points and poor touch resulting from an increase in the capacitance value of the display region on a side close to the conductive portion, which can solve the problem regarding serious influence of the conductive portion on the capacitance value of the display region on a side closest to the conductive portion.

In an embodiment of the present disclosure, the array substrate is provided with a grounding portion. The grounding portion is electrically connected to the black matrix located in the frame region through the conductive portion. The grounding portion can help to release charges accumulated in the display region, thereby preventing breakdown of the display panel which will in turn cause damage to the display panel. The conductive portion may be, but is not limited to, a conductive silver paste. The grounding portion is arranged on a side of the array substrate where an IC (Integrated Circuit) 13 is disposed. The number of grounding portions may be, but is not limited to, two, and the two grounding portions are symmetrically distributed on the array substrate. The IC is arranged between the two grounding portions, which makes the structure more compact and can minimize the width of the frame region. The conductive portion connects the two grounding portions to facilitate rapid release of charges. The first through groove is at least partially located between the conductive portion and the display region, and the first through groove penetrates the black matrix along the thickness direction of the black matrix. As a result, the first through groove realizes separation of the conductive portion from the display region, which reduces or even avoids the influence of the conductive portion on the capacitance value of the display region, and avoids spurious explosion points and poor touch resulting from an increase in the capacitance value of the display region on a side close to the conductive portion. The spurious explosion point means that the display panel will be occasionally touched in the case of not touching the display panel.

Figure 5:
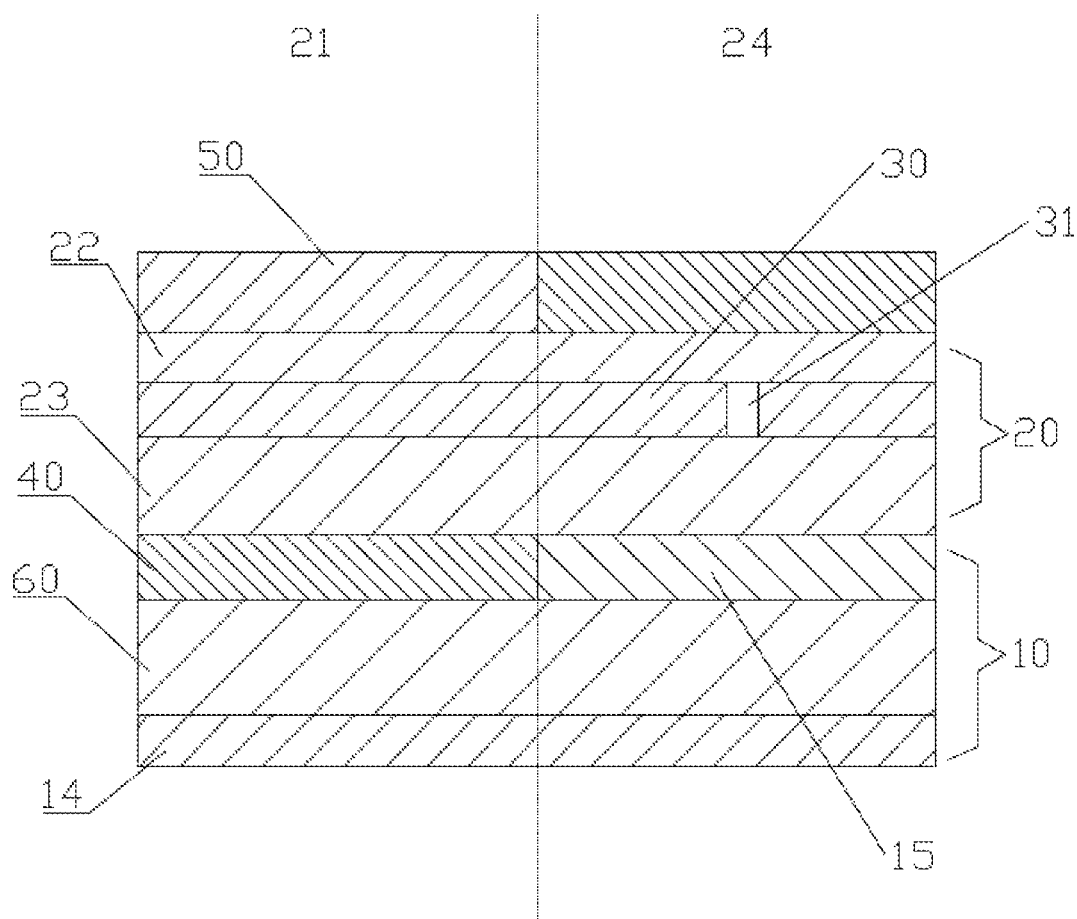
FIG. 5 is a partial sectional view taken along line A-A in FIG. 4.

Referring to FIG. 5, FIG. 5 is a partial sectional view taken along line A-A in FIG. 4. The display panel comprises an array substrate 10 and a color filter substrate 20 arranged opposite to each other. The array substrate 10 comprises a first substrate 14, a touch electrode 40 disposed on the first substrate 14, and an intermediate film layer 60 between the touch electrode 40 and the first substrate 14. The intermediate film layer 60 may be a film other than the touch electrode 40. The intermediate film layer 60 may be, but is not limited to, a passivation layer, a planarization layer, and the like. The color filter substrate 20 comprises a second substrate 22. A black matrix layer 30 and a color film layer 23 are stacked on the second substrate 22 successively. The array substrate 10 and the color filter substrate 20 are bonded together by a sealant 15. Optionally, the display panel may further comprise a polarizer 50, and the polarizer 50 is disposed on a side of the color filter substrate 20 facing away from the array substrate 10.

Figure 6:
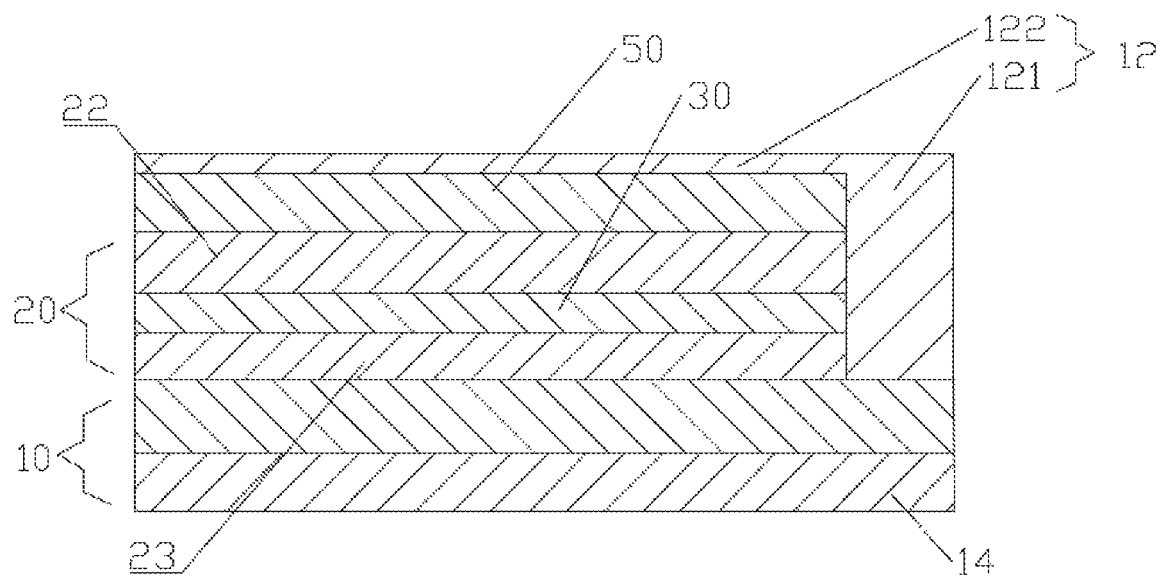
FIG. 6 is a partial sectional view taken along line B-B in FIG. 4.

Referring to FIG. 6, FIG. 6 is a partial sectional view taken along line B-B in FIG. 4. The display panel comprises an array substrate 10 and a color filter substrate 20 arranged opposite to each other, and the array substrate 10 comprises a first substrate 14. The color filter substrate 20 comprises a second substrate 22 and a black matrix layer 30 on the color filter substrate 20. The display panel may further comprise a polarizer 50, and the polarizer 50 is disposed on a side of the color filter substrate 20 facing away from the array substrate 10. The conductive portion 12 comprises a first conductive portion 122 extending laterally as shown in FIG. 6 and a second conductive portion 121 extending longitudinally as shown in FIG. 6. The first conductive portion 122 is located on a side of the polarizer 50 facing away from the color filter substrate 20. The second conductive portion 121 is located on side surfaces of the polarizer 50 and the color filter substrate 20, and is connected to the grounding portion 11 (not shown in FIG. 6) on the array substrate 10 so as to help to release charges accumulated in the display region, thereby preventing breakdown of the display panel.

Further, the first through groove 31 completely separates the conductive portion 12 from the display region 21.

In the embodiment of the present disclosure, the first through groove completely separates the conductive portion from the display region, which can completely avoid the influence of the conductive portion on the capacitance value of the display region on a side close to the conductive portion, and increase the service life and reliability of a display device.

Further, the portion of the black matrix 30 located in the frame region 24 is further provided with a second through groove 35 surrounding the display region. The second through groove 35 is located on a side of the display region 21 away from the first through groove 31, and penetrates the black matrix 30 along the thickness direction of the black matrix 30. A disconnection region 34 is disposed between the first through groove 31 and the second through groove 35.

Arranging the first through groove and the second through groove surrounding the display region in the black matrix can reduce the intrusion of external moisture into the display region. At least one disconnection region is disposed between the first through groove and the second through groove. "Disconnection region" means that the first through groove and the second through groove are disconnected in this region (i.e., not communicating with each other), or that no through groove is disposed in the disconnection region. As a result, it is convenient for charges of the display region to be released from the conductive portion and the grounding portion along the disconnection region, thereby preventing breakdown of the display panel.

Further, the frame region 24 comprises a first side 241 and a second side 242 that are adjacent and perpendicular to each other, and the grounding portion 11 is located at the first side 241. The first through groove 31 includes a first isolation portion 32 located between the conductive portion 12 and the display region 21, and the first isolation portion 32 is arranged along the length direction of the first side 241.

In an embodiment of the present disclosure, the first isolation portion is used to separate the conductive portion from the display region. The first isolation portion is arranged along the length direction of the first side, which facilitates the design of modules on the color filter substrate and decreases the design difficulty. At the same time, the difficulty in processing the color filter substrate is also decreased, which facilitates production of the color filter substrate. It can also reduce the influence of the first isolation portion on the frame width.

Further, the first through groove 31 further includes a first extension portion 33. The first extension portion 33 is connected to the first isolation portion 32 and extends toward the second through groove 35 along the length direction of the second side 242. The disconnection region 34 is located between the first extension portion 33 and the second through groove 35.

In an embodiment of the present disclosure, the first extension portion can better isolate the conductive portion from the display region, avoid the influence of the conductive portion on the capacitance value of the display region, and avoid spurious explosion points and poor touch resulting from an increase in the capacitance value of the display region on a side close to the conductive portion. The position of the disconnection region and the length of the disconnection region can be adjusted by adjusting the length of the first extension portion. As a result, it is possible to adjust the charge release path and charge release speed in the display region, which facilitates the design of modules on the color filter substrate, and decreases the difficulty in designing the color filter substrate and the display panel. At the same time, the first extension portion can reduce the intrusion of external moisture into the display region, thereby improving the reliability of the display panel. The first extension portion is arranged along the length direction of the second side, which facilitates the design of modules on the color filter substrate, decreases the design difficulty, and can also reduce the influence of the first extension portion on the frame width.

Further, at the position where the first extension portion 33 is provided on the black matrix 30, the black matrix 30 comprises a first sub-black matrix 331 and a second sub-black matrix 332 located on two sides of the first extension portion 33 respectively. The first sub-black matrix 331 is located on a side of the first extension portion 33 away from the display region 21. The width 3311 of the first sub-black matrix is greater than or equal to 100 μm.

In the embodiment of the present disclosure, the width 3311 of the first sub-black matrix is greater than or equal to 100 μm. As a result, it prevents the first extension portion from being too close to the edge of the color filter substrate, thereby decreasing the difficulty in designing and processing modules on the color filter substrate, makes it convenient for processing of the first extension portion and the first through groove on the color filter substrate, and reduces the manufacturing cost of the color filter substrate.

Further, the second through groove 35 includes a second isolation portion 36. The second isolation portion 36 is located on a side of the black matrix 30 opposite to the conductive portion 12, and arranged along the length direction of the first side 241.

In the embodiment of the present disclosure, the second isolation portion can reduce the intrusion of external moisture into the display region. At the same time, the second isolation portion can control the charge release path in the display region so as to prevent charges from being released from a side of the black matrix opposite to the conductive portion, which ensures the charge release speed in the display region, effectively protects the display region, and avoids occurrence of electrostatic breakdown in the display region. The second isolation portion is arranged along the length direction of the first side, which facilitates the design of modules on the color filter substrate and decreases the design difficulty. Meanwhile, the difficulty in processing the color filter substrate is also decreased, which facilitates production of the color filter substrate and can also reduce the influence of the second isolation portion on the frame width.

Further, the second through groove 35 further includes a second extension portion 37. The second extension portion 37 is connected to the second isolation portion 36 and extends toward the first through groove 31 along the length direction of the second side 242. The disconnection region 34 is located between the second extension portion 37 and the first through groove 31.

In an embodiment of the present disclosure, the length of the second extension portion may be designed according to actual conditions, and the position of the disconnection region and the length of the disconnection region can be adjusted by adjusting the length of the second extension portion. As a result, it is possible to adjust the charge release path and charge release speed in the display region, which facilitates the design of modules on the color filter substrate, and decreases the difficulty in designing the color filter substrate and the display panel. At the same time, the second extension portion can reduce the intrusion of external moisture into the display region, which improves the reliability of the display panel. The second extension portion is arranged along the length direction of the second side, which facilitates the design of modules on the color filter substrate, decreases the design difficulty, and can also reduce the influence of the second extension portion on the frame width.

Further, at the position where the second extension portion 37 is provided on the black matrix 30, the black matrix 30 comprises a third sub-black matrix 371 and a fourth sub-black matrix 372 located on two sides of the second extension portion 37 respectively. The third sub-black matrix 371 is located on a side of the second extension portion 37 away from the display region 21. The width 3711 of the third sub-black matrix 371 is greater than or equal to 100 μm.

In the embodiment of the present disclosure, the width 3711 of the third sub-black matrix is greater than or equal to 100 μm. This prevents the second extension portion from being too close to the edge of the color filter substrate, thereby decreasing the difficulty in designing and processing modules on the color filter substrate. Therefore, it is convenient for processing of the second extension portion and the second through groove on the color filter substrate, which reduces the manufacturing cost of the color filter substrate.

Further, the length of the disconnection region 34 along the length direction of the second side 242 is greater than or equal to one third of the length of the second side 242.

In an embodiment of the present disclosure, charges in the display region are released from the conductive portion and the grounding portion along the disconnection region, which ensures the charge release speed in the display region, prevents breakdown of the display region, and improves the reliability of the display panel.

Figure 7:
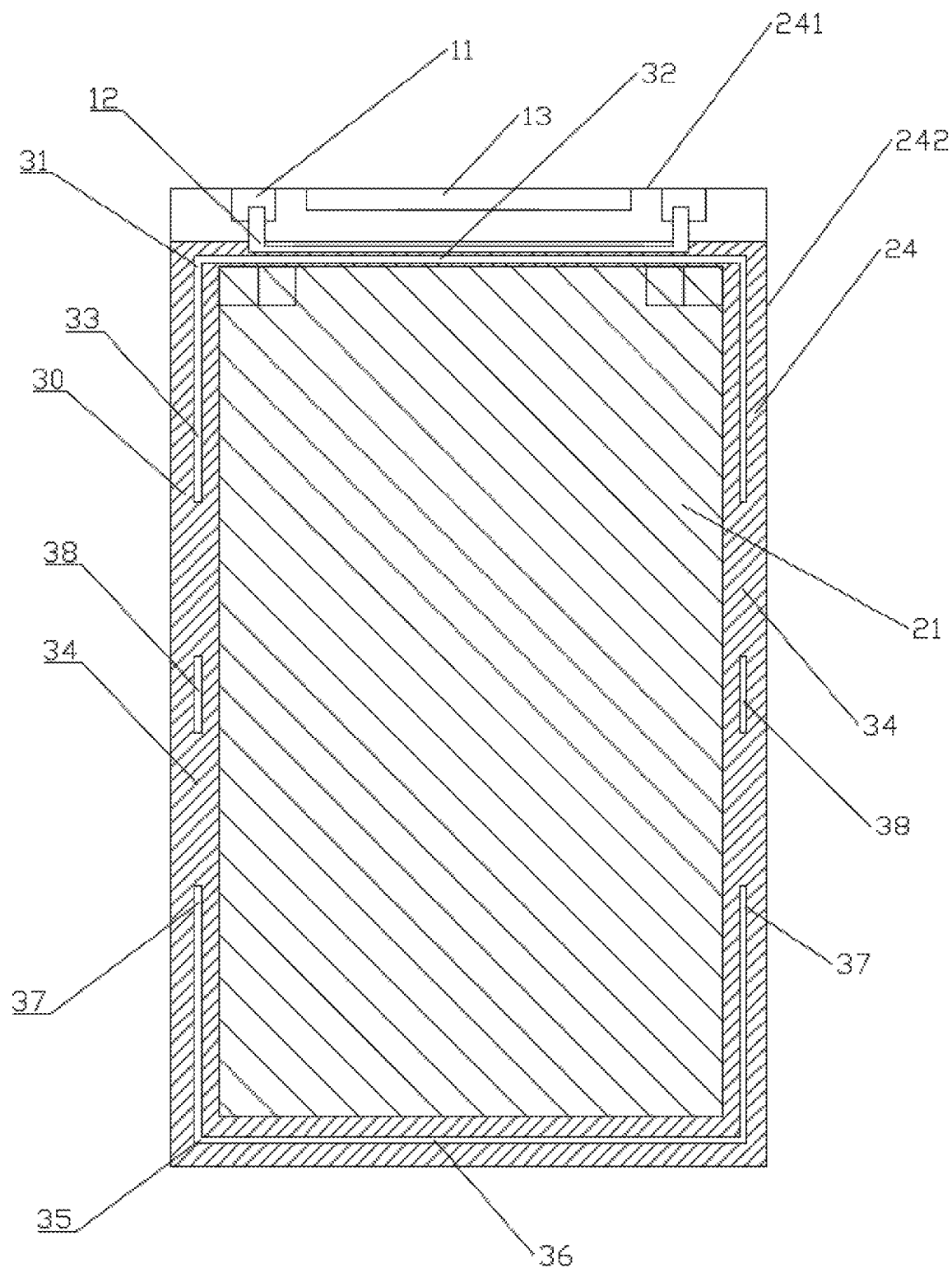
FIG. 7 is a schematic view illustrating the structure of a display panel according to another embodiment of the disclosure.

Referring to FIG. 7, further, the black matrix 30 further comprises a third through groove 38, and the third through groove 38 is located between the first through groove 31 and the second through groove 35.

In the embodiment of the present disclosure, the third through groove may be one or more sections. In case the third through groove is multi-segmented, a disconnection region is also disposed between adjacent third through grooves. The third through groove may be designed according to different products. The third through groove can adjust and change the path of static electricity discharge in the display region, and can also reduce the intrusion of external moisture into the display region. The third through groove is arranged along the length direction of the second side, which facilitates the design of modules on the color filter substrate, decreases the design difficulty, and can also reduce the influence of the third through groove on the frame width.

Further, the width of the first through groove 31 and the width of the second through groove 35 both range from 20 to 50 μm.

In the embodiment of the present disclosure, the width of the first through groove and the width of the second through groove both range from 20 to 50 μm, which can ensure the shielding effect of the first through groove on the conductive portion, and the isolation effect of the first through groove and the second through groove on moisture. At the same time, it facilitates processing of the first through groove and the second through groove, reduces the influence of the first through groove and the second through groove on the strength of the color filter substrate, as well as the interference of the first through groove and the second through groove to other modules on the color filter substrate, and decreases the difficulty in designing and processing the color filter substrate.

Further, the disconnection region 34 is located in a portion of the black matrix 30 corresponding to the second side 242.

In the embodiment of the present disclosure, the disconnection region 34 is located in a portion of the black matrix 30 corresponding to the second side 242, which shortens the distance between the display region and the conductive portion through the disconnection region, facilitates rapid release of charges in the display region, and ensures the reliability of the display panel.

Further, the cross section of the first through groove 31 and the cross section of the second through groove 35 are both rectangular.

In the embodiment of the present disclosure, the cross section of the first through groove and the cross section of the second through groove are both rectangular, which facilitates processing of the first through groove and the second through groove on the color filter substrate. At the same time, it can also ensure the shielding effect of the first through groove on the conductive portion as well as the isolation effect of the first through groove and the second through groove on moisture.

Another embodiment of the present disclosure is a display device comprising the display panel described in any of the foregoing embodiments.

In the embodiment of the present disclosure, the first through groove can reduce or even avoid the influence of the conductive portion on the capacitance value of the display region, and avoid spurious explosion points and poor touch resulting from an increase in the capacitance value of the display region on a side close to the conductive portion. The disconnection region helps to release charges in the display region from the conductive portion and the grounding portion along the disconnection region, which prevents breakdown of the display panel, thereby improving the reliability of the display device.

What have been stated above are only specific embodiments of the present disclosure, but the protection scope of the present disclosure is not limited thereto. Any variations or substitutions that can be easily conceived by those skilled in the art familiar with this technical field within the technical scope revealed by the present disclosure should be encompassed within the protection scope of the present disclosure. Thus, the protection scope of the present disclosure should be based on the protection scope of the claims.

Reference signs: 1—black matrix, 2—touch electrode, 3—conductive silver paste, 4—through groove, 5—grounding portion, 10—array substrate, 11—grounding portion, 12—conductive portion, 121—first conductive portion, 122—second conductive portion, 13—IC, 14—first substrate, 15—sealant, 20—color filter substrate, 21—display region, 22—second substrate, 23—color film layer, 24—frame region, 30—black matrix, 31—first through groove, 32—first isolation portion, 33—first extension portion, 331—first sub-black matrix, 3311—width of first sub-black matrix, 332—second sub-black matrix, 34—disconnection region, 35—second through groove, 36—second isolation portion, 37—second extension portion, 371—third sub-black matrix, 3711—width of third sub-black matrix, 372—fourth sub-black matrix, 38—third through groove, 40—touch electrode, 50—polarizer, 60—intermediate film layer.

The invention claimed is:

1. A display panel, comprising: a display region, a frame region surrounding the display region, a color filter substrate, and an array substrate opposite to the color filter substrate,
wherein a black matrix is disposed on a side of the color filter substrate facing the array substrate; the array substrate is provided with a grounding portion located in the frame region; the grounding portion is electrically connected to a portion of the black matrix located in the frame region through a conductive portion;
the portion of the black matrix located in the frame region is provided with a first through groove surrounding the display region; the first through groove penetrates the black matrix along a thickness direction of the black matrix; a portion of the first through groove is located between the conductive portion and the display region;
wherein the portion of the black matrix located in the frame region is further provided with a second through groove surrounding the display region; the second through groove is located on a side of the display region away from the first through groove; the second through groove penetrates the black matrix along the thickness direction of the black matrix; a disconnection region is disposed between the first through groove and the second through groove, the disconnection region disconnects an end of the first through groove from an end of the second through groove, and the disconnection region is a charge release path between the display region and the conductive portion.

2. The display panel according to claim 1, wherein the first through groove completely separates the conductive portion from the display region.

3. The display panel according to claim 1, wherein the frame region comprises a first side and a second side that are adjacent and perpendicular to each other, the grounding portion is located at the first side; the first through groove comprises a first isolation portion located between the conductive portion and the display region and arranged along a length direction of the first side.

4. The display panel according to claim 3, wherein the first through groove further comprises a first extension portion, the first extension portion is connected to the first isolation portion and extends toward the second through groove along a length direction of the second side; the disconnection region is located between the first extension portion and the second through groove.

5. The display panel according to claim 4, wherein at a position where the first extension portion is provided on the black matrix, the black matrix comprises a first sub-black matrix and a second sub-black matrix located on two sides of the first extension portion respectively, the first sub-black matrix is located on a side of the first extension portion away from the display region, the first sub-black matrix has a width greater than or equal to 100 μm.

6. The display panel according to claim 1, wherein the second through groove comprises a second isolation portion located on a side of the black matrix opposite to the conductive portion and arranged along a length direction of the first side.

7. The display panel according to claim 6, wherein the second through groove further comprises a second extension portion, the second extension portion is connected to the second isolation portion and extends toward the first through groove along a length direction of the second side; the disconnection region is located between the second extension portion and the first through groove.

8. The display panel according to claim 7, wherein at a position where the second extension portion is provided on the black matrix, the black matrix comprises a third sub-black matrix and a fourth sub-black matrix located on two sides of the second extension portion respectively, the third sub-black matrix is located on a side of the second extension portion away from the display region, the third sub-black matrix has a width greater than or equal to 100 μm.

9. The display panel according to claim 1, wherein a length of the disconnection region along a length direction of the second side is greater than or equal to one third of a length of the second side.

10. The display panel according to claim 1, wherein the black matrix further comprises a third through groove located between the first through groove and the second through groove.

11. The display panel according to claim 1, wherein a width of the first through groove and a width of the second through groove are in a range of 20-50 μm.

12. The display panel according to claim 1, wherein a cross section of the first through groove and a cross section of the second through groove are both rectangular.

13. A display device comprising the display panel according to claim 1.

14. The display device according to claim 13, wherein the first through groove completely separates the conductive portion from the display region.

15. The display device according to claim 13, wherein the frame region comprises a first side and a second side that are adjacent and perpendicular to each other, the grounding portion is located at the first side; the first through groove comprises a first isolation portion located between the conductive portion and the display region and arranged along a length direction of the first side.

16. The display device according to claim 15, wherein the first through groove further comprises a first extension portion, the first extension portion is connected to the first isolation portion and extends toward the second through groove along a length direction of the second side; the disconnection region is located between the first extension portion and the second through groove.

17. The display device according to claim 16, wherein at a position where the first extension portion is provided on the black matrix, the black matrix comprises a first sub-black matrix and a second sub-black matrix located on two sides of the first extension portion respectively, the first sub-black matrix is located on a side of the first extension portion away from the display region, the first sub-black matrix has a width greater than or equal to 100 μm.

18. The display device according to claim 13, wherein the second through groove comprises a second isolation portion located on a side of the black matrix opposite to the conductive portion and arranged along a length direction of the first side.

* * * * *